United States Patent
Ku et al.

(10) Patent No.: US 8,106,673 B2
(45) Date of Patent: Jan. 31, 2012

(54) PROBE FOR HIGH FREQUENCY SIGNAL TRANSMISSION

(75) Inventors: Wei-Cheng Ku, Hsinchu Hsiang (TW);
Chih-Hao Ho, Hsinchu Hsiang (TW);
Chia-Tai Chang, Hsinchu Hsiang (TW);
Ho-Hui Lin, Hsinchu Hsiang (TW);
Chien-Ho Lin, Hsinchu Hsiang (TW)

(73) Assignee: MPI Corporation, Chu-Pei (TW)

( * ) Notice: Subject to any disclaimer, the term of this patent is extended or adjusted under 35 U.S.C. 154(b) by 13 days.

(21) Appl. No.: 12/788,291

(22) Filed: May 26, 2010

(65) Prior Publication Data

US 2010/0253378 A1   Oct. 7, 2010

Related U.S. Application Data

(62) Division of application No. 11/970,739, filed on Jan. 8, 2008, now Pat. No. 7,791,359.

(30) Foreign Application Priority Data

Jan. 8, 2007   (TW) ................................ 96100746 A

(51) Int. Cl.
*G01R 31/20* (2006.01)
(52) U.S. Cl. ................ 324/754.06; 324/754.01
(58) Field of Classification Search .......... None
See application file for complete search history.

(56) References Cited

U.S. PATENT DOCUMENTS

| | | | | |
|---|---|---|---|---|
| 5,594,358 A * | 1/1997 | Ishikawa et al. | ............. | 324/762 |
| 6,507,204 B1 * | 1/2003 | Kanamaru et al. | ........ | 324/755.07 |
| 7,248,064 B2 * | 7/2007 | Lee et al. | .................. | 324/754.03 |
| 7,368,928 B2 * | 5/2008 | Lin et al. | ........................ | 324/754 |
| 7,579,857 B2 * | 8/2009 | Chen | .............................. | 324/762 |
| 7,683,645 B2 * | 3/2010 | Ku et al. | ........................ | 324/754 |
| 2003/0132769 A1 * | 7/2003 | Boll et al. | ..................... | 324/754 |
| 2007/0200584 A1 * | 8/2007 | Ku | ................................ | 324/761 |
| 2008/0007278 A1 * | 1/2008 | Ku et al. | ........................ | 324/754 |
| 2008/0164900 A1 | 7/2008 | Ku et al. | | |
| 2008/0191726 A1 * | 8/2008 | Ku et al. | ....................... | 324/762 |
| 2009/0212801 A1 * | 8/2009 | Ku et al. | ....................... | 324/754 |

FOREIGN PATENT DOCUMENTS

| | | |
|---|---|---|
| CN | 1095483 A | 11/1994 |
| CN | 2715341 Y | 8/2005 |

* cited by examiner

*Primary Examiner* — Jermele M Hollington
(74) *Attorney, Agent, or Firm* — Ding Yu Tan

(57) ABSTRACT

A probe for high frequency signal transmission includes a metal pin, and a metal line spacedly arranged on and electrically insulated from the metal pin and electrically connected to grounding potential so as to maintain the characteristic impedance of the probe upon transmitting high frequency signal. The maximum diameter of the probe is substantially equal to or smaller than two times of the diameter of the metal pin. Under this circumstance, a big amount of probes can be installed in a probe card for probing a big amount of electronic devices, so that a wafer-level electronic test can be achieved efficiently and rapidly.

14 Claims, 14 Drawing Sheets

PROBE FOR HIGH FREQUENCY SIGNAL TRANSMISSION

CROSS-REFERENCE TO RELATED APPLICATIONS

This application is a divisional of an application Ser. No. 11/970,739, filed on Jan. 8, 2008, now pending, which claims the priority benefit of Taiwan application serial no. 096100746, filed on Jan. 8, 2007. The entirety of each of the above-mentioned patent applications is hereby incorporated by, reference herein and made a part of this specification.

FIELD OF THE INVENTION

The present invention relates generally to probe cards and more particularly, to a probe adapted to be used in a probe card for high frequency signal transmission.

BACKGROUND OF THE INVENTION

FIG. 1 shows a cantilever-type probe card 1 according to a design of prior art. According to this design, the cantilever-type probe card 1 comprises a circuit board 10, a plurality of coaxial transmission lines 11 arranged around the outer area of the circuit board 10, a probe holder 12 arranged on the inner area of the circuit board 10, and a plurality of coaxial probes 20. The probe holder 12 comprises an insulated base 121 made of a shock-absorbable electrically insulated material, a grounding body 122 made of a metal material and disposed on the insulated base 121 and electrically connected to grounding potential of the cantilever-type probe card 1, and a plurality of locating members 123 fixedly provided on the grounding body 122 to secure the coaxial probes 20. The probes 20 each comprise a metal pin 21, which has a front part 201 (the part between the respective locating member 123 and the probing tip of the respective metal pin 21) and a rear part 202 (the part between the respective locating member 123 and the circuit board 10), a dielectric layer 22 surrounding the rear part 202, and a metal conducting layer 23 surrounding the dielectric covering 22. The metal conducting layer 23 is contacted with the grounding body 122 so as to be electrically connected to grounding potential. Therefore, the coaxial structure of the rear end of each coaxial probe 20 effectively maintains characteristic impedance during transmission of a high frequency signal.

Because the front part 201 of each coaxial probe 20 is designed to serve as an elastic lever arm for bearing and buffering the reaction force fed back from the probing tip when the probing tip is probing the test sites on a wafer under test, it requires a sufficient ambient space for enabling its movement. Therefore, the front part 201 cannot be designed to have a coaxial structure as the rear part 202, i.e., the maintenance of characteristic impedance during high-frequency transmission is limited to the rear parts 202 of the coaxial probes 20, not available at the front parts 201 of the coaxial probes 20. Therefore, the parasitic capacitor induced by the surrounding dielectric environment around each coaxial probe 20 may cause dielectric loss during high-frequency signal transmission.

Further, because the metal pin 21 of each coaxial probe 20 must be surrounded by a certain thickness of dielectric layer 22 to maintain the desired characteristic impedance of the signal transmission, and the installation of the dielectric layer 22 must consider the dielectric loss caused by the parasitic capacitor between the metal pin 21 and the metal conducting layer 23 to avoid the production of a mismatched impedance, the surrounded insulated material must have an optimal thickness varied with its dielectric constant. Whatever insulated material is selected, the diameter of the coaxial probe 20 is much greater than the diameter of the metal pin 21, thereby limiting the arrangement density of the probes 20. Therefore, the aforesaid prior art cantilever-type probe card does not allow for a big number of probes for probing big count of electronic devices with high frequency signaling.

Therefore, it is desirable to provide a cantilever-type probe card that has a high quality of circuit structure for probing highly integrated electronic components rapidly while maintaining the signal quality during transmission of a high frequency test signal for high-precision testing.

SUMMARY OF THE INVENTION

The present invention has been accomplished under the circumstances in view. It is therefore one objective of the present invention to provide a probe for use in a probe card for high frequency signal transmission, which can maintain the characteristic impedance of the high frequency test signal.

To achieve the above-mentioned objective, the probe for high frequency signal transmission provided by the present invention comprises a metal pin, a metal line spacedly arranged on the metal pin, and an insulated layer disposed between the metal pin and the metal line to isolate the metal line from the metal pin.

In an exemplary embodiment to be detailedly described hereinafter, the probe comprises a lead wire attached on the aforesaid metal pin. The lead wire includes the aforesaid metal line and the insulated layer coaxially surrounding the metal line, so that the metal line is separated and electrically insulated from the metal pin.

In another exemplary embodiment, the metal pin is coaxially surrounded by the insulated layer such that the metal line is separated and electrically insulated from the metal pin.

In still another exemplary embodiment, the probe comprises two or more lead wires attached on the metal pin.

It is another objective of the present invention to provide a probe card using the aforesaid probes for high frequency signal transmission, which can employ a big number of probes and improve the test quality.

To achieve the aforesaid objective, the probe card provided by the present invention comprises a circuit board, a probe holder, a plurality of signal probes, and a plurality of grounding probes. The circuit board defines a top surface and a bottom surface. The top surface is for electrically connecting to a test machine for testing electronic devices. The circuit board has arranged thereon a plurality of signal circuits and grounding circuits. The signal circuits and the grounding circuits are so arranged that at least one grounding circuit is spacedly disposed adjacent to one signal circuit. The grounding circuits are electrically connected to grounding potential. The probe holder is mounted on the bottom surface of the circuit board. The signal probes each comprise a metal pin, and at least one lead wire arranged on and electrically insulated from the metal pin and electrically connected to the grounding probes. The metal pins of the signal probes and the grounding probes each have a probing tip, a posterior portion, and a positioning portion located between the posterior portion and the probing tip. The positioning portion is secured to the probe holder. The posterior portions of the metal pins of the signal probes are electrically connected to the signal circuits. The posterior portions of the grounding probes are electrically connected to the grounding circuits.

According to another embodiment of the present invention, the probe card has different signal paths for transmitting test signal and the correspondingly resultant sense signal to prevent interference between test signal and sense signal. According to this embodiment, the probe card is comprised of a circuit board, a probe holder, a plurality of signal probes, and a plurality of grounding probes. The circuit board defines a top surface and a bottom surface opposite to the top surface. The top surface is for electrically connecting to a test machine for testing electronic devices. The circuit board has arranged thereon a plurality of signal circuits and grounding circuits. The signal circuits and the grounding circuits are so arranged that at least one grounding circuit is disposed adjacent to one signal circuit and kept apart from the signal circuit at a predetermined distance. The grounding circuits are electrically connected to grounding potential. The signal circuits each comprise a forcing wire and a sensing wire. The forcing wire is adapted to transmit a test signal from a test machine to a test sample. The sensing wire is adapted to transmit a sense signal of the corresponding test result from the test sample to the test machine. The probe holder is mounted on the bottom surface of the circuit board. The signal probes each comprise a metal pin, and at least one lead wire arranged on the metal pin and having two distal ends respectively electrically connected to the metal pin and the sensing wire of one of the signal circuits. The grounding probes are so arranged that at least one grounding probe is disposed adjacent to each of the signal probes and spaced from the adjacent signal probe at a predetermined distance. The metal pins of the signal probes and the grounding probes each have a probing tip, a posterior portion, and a positioning portion located between the posterior portion and the probing tip. The positioning portion is secured to the probe holder. The posterior portions of the metal pins of the signal probes are electrically connected to the forcing wires of the signal circuits. The posterior portions of the grounding probes are electrically connected to the grounding circuits.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
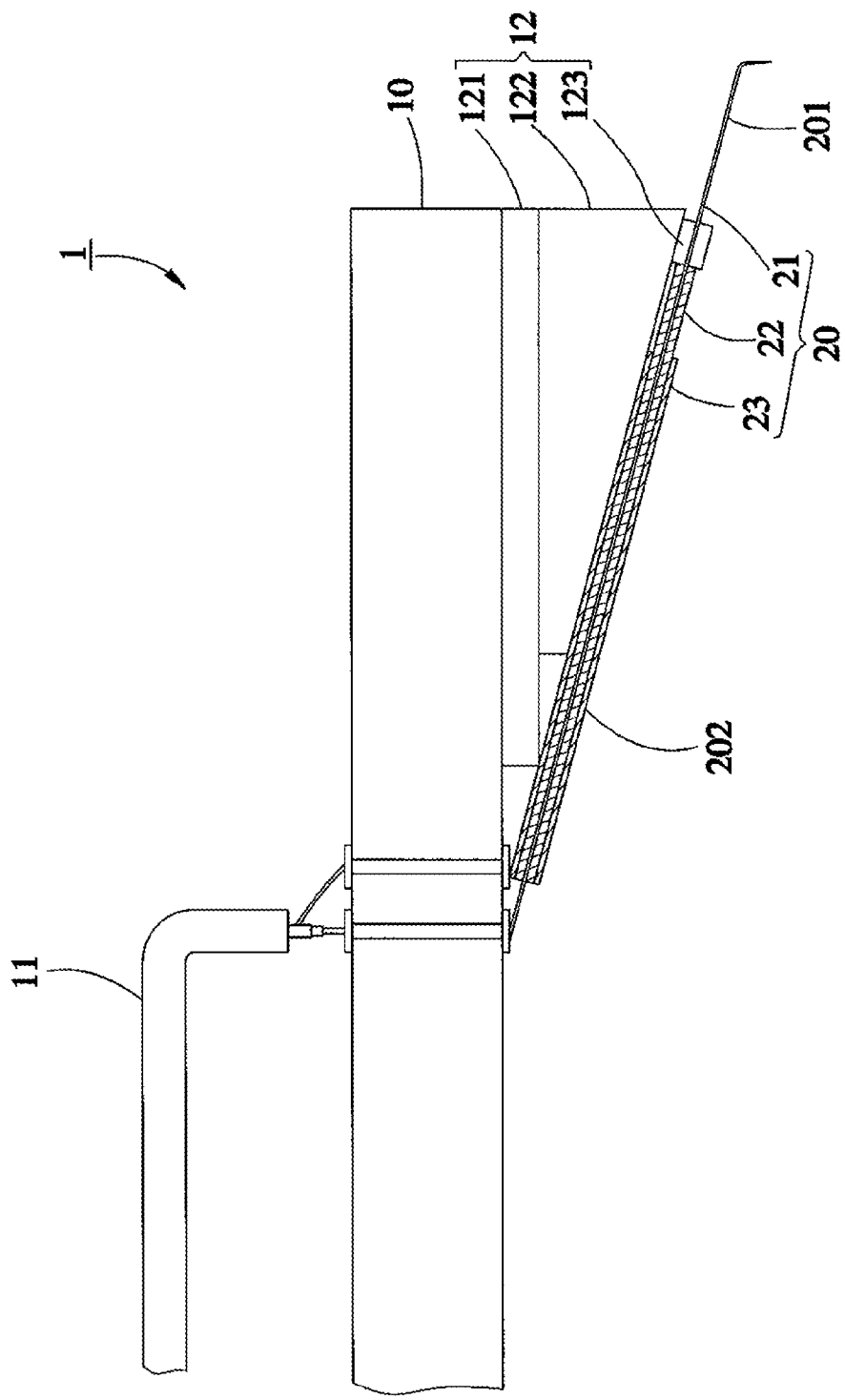
FIG. 1 is a schematic sectional view of a cantilever-type probe card according to a design of prior art.

Referring to FIGS. 2-5, a cantilever-type probe card 2 for testing semiconductor wafers or the like in accordance with a first embodiment of the present invention comprises a circuit board 30, a probe holder 40, a plurality of signal probes 50, and a plurality of grounding probes 60.

Figure 2:
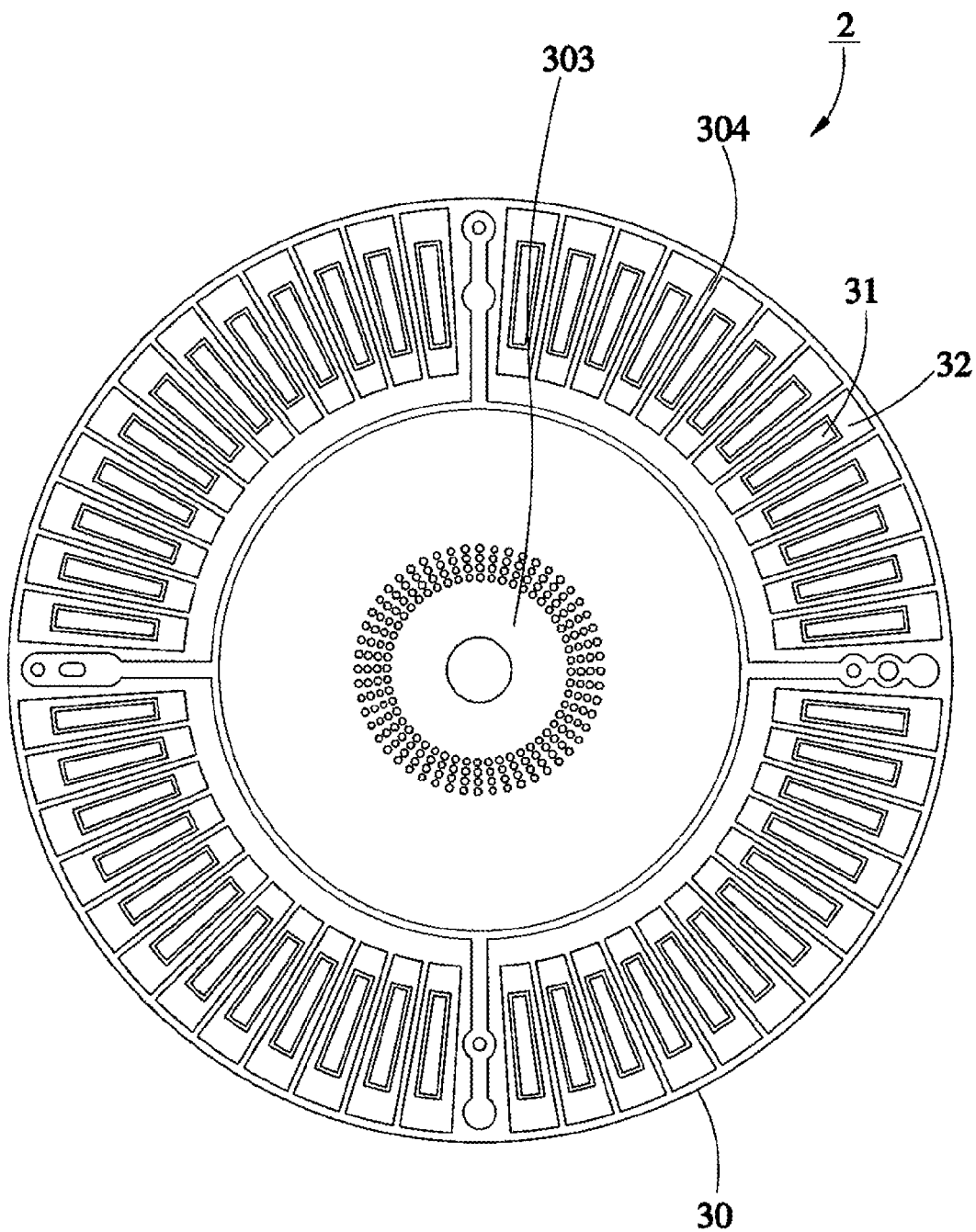
FIG. 2 is a top view of a cantilever-type probe card according to a first embodiment of the present invention.
Figure 3:
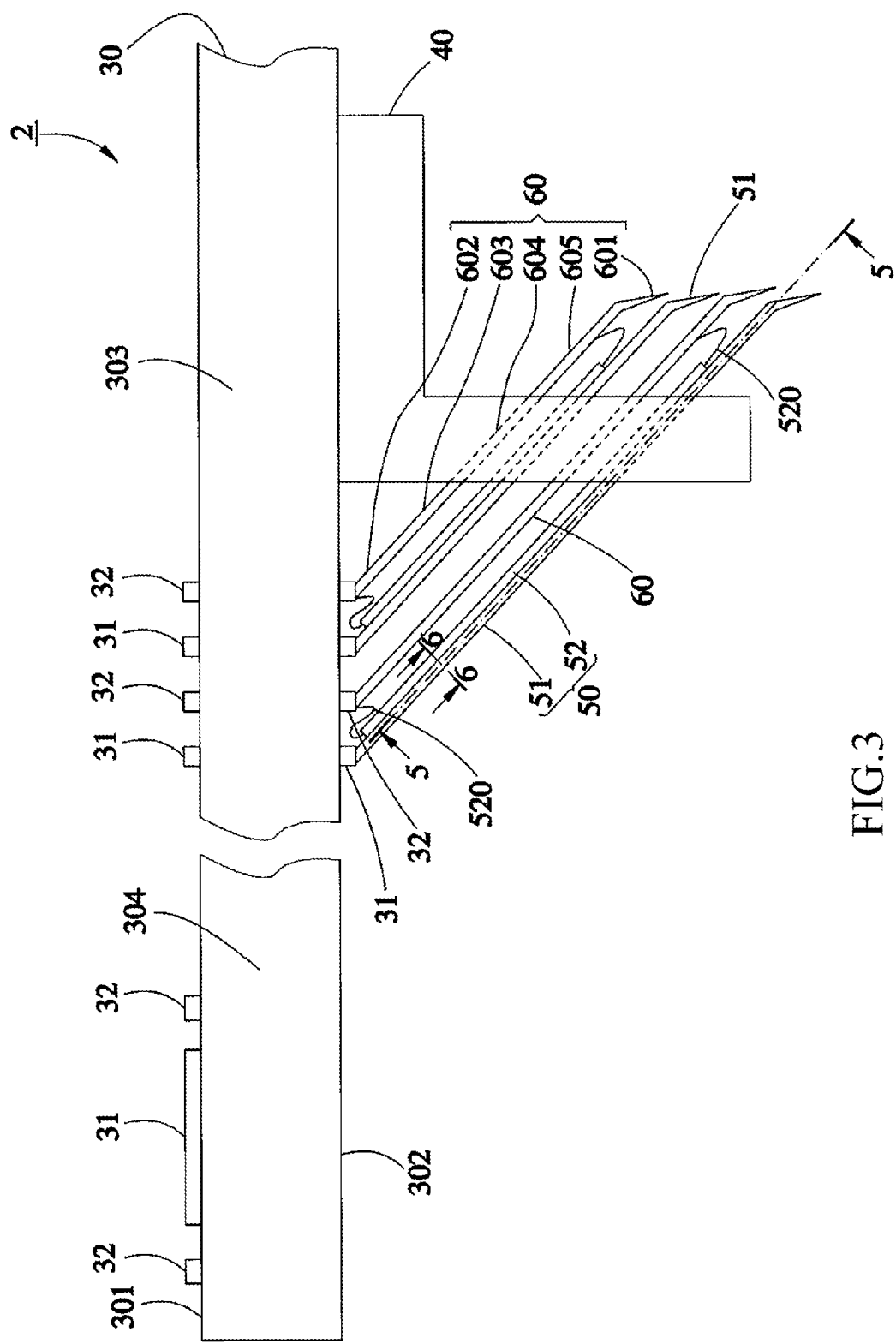
FIG. 3 is a schematic sectional view in an enlarged scale of a part of the cantilever-type probe card in accordance with the first embodiment of the present invention.
Figure 4:
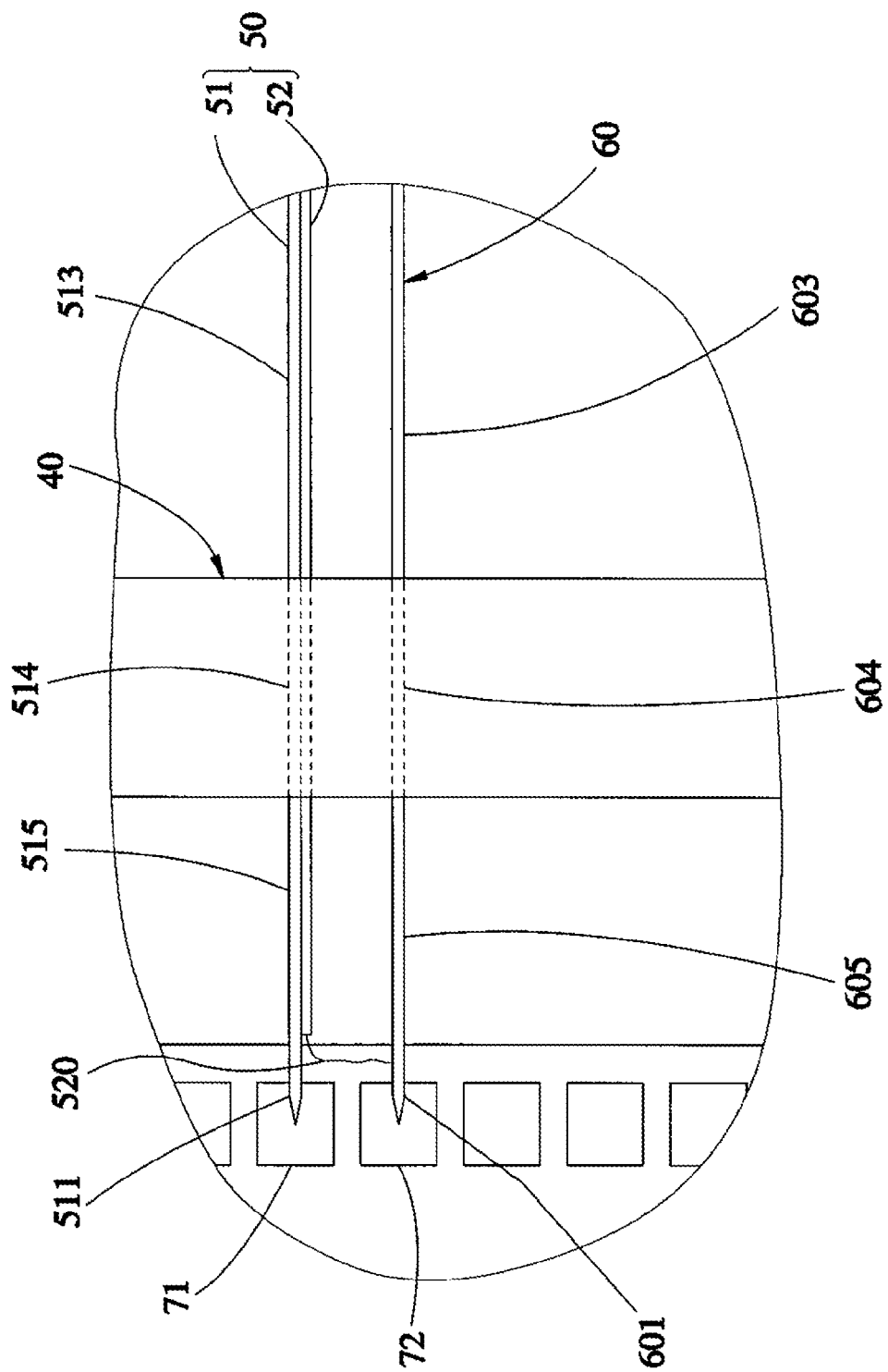
FIG. 4 is a bottom view in an enlarged scale of a part of the first embodiment of the present invention, showing the relationship between the signal probe and the grounding probe.
Figure 5:
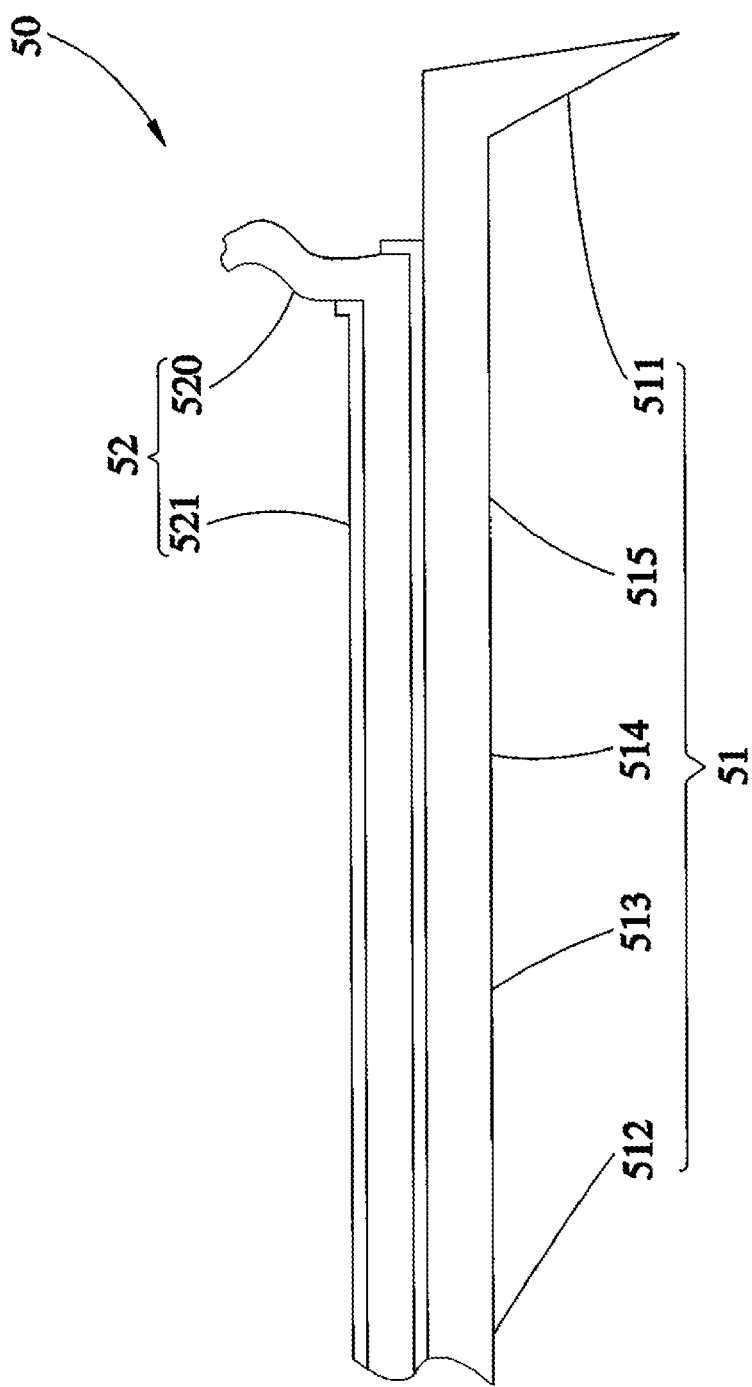
FIG. 5 is a sectional view taken along line 5-5 of FIG. 3.

As shown in FIGS. 2 and 3, the circuit board 30 defines a top surface 301 and a bottom surface 302 opposite to the top surface 301, and is divided into an inner probing zone 303 and an outer testing zone 304 around the inner probing zone 303. The outer testing zone 304 at the top surface 301 is to be electrically connected to a test machine (not shown), which is controllable to output an electrical test signal to the probe card 2 for providing a high frequency test signal to the inner probing zone 303. The circuit board 30 has arranged thereon electronic circuits including multiple signal circuits 31 and grounding circuits 32, which extend from the top surface 301 to the bottom surface 302 and are electrically connected to the signal probes 50 and the grounding probes 60. The signal circuits 31 are adapted to transmit the aforesaid high frequency test signal. The grounding circuits 32 are respectively spaced from the signal circuits 31 at a predetermined distance. The grounding circuits 32 are directly or indirectly connected to the grounding potential of the test machine to maintain the characteristic impedance of the signal circuits 31 upon transmission of the aforesaid high frequency test signal.

The probe holder 40 is made of an insulated material, for example, epoxy resin, and annually mounted on the bottom surface 302 of the circuit board 30 within the inner probing zone 303 to hold the signal probes 50 and the grounding probes 60 in place and to keep the probes 50 and 60 isolated from one another.

Referring to FIGS. 3-5 again, each signal probe 50 comprises a metal pin 51 and a lead wire 52. The metal pin 51 is divided into a probing tip 511 at one end, a posterior portion 512, and a connection portion 513, a positioning portion 514 and a lever arm 515 integrally arranged from the posterior portion 512 toward the probing tip 511 in order. The probing tip 511 is adapted to probe the testing pad 71 that is provided at the electronic device of the semiconductor wafer under test and designed to receive a high frequency test signal. The posterior portion 512 is electrically connected to one of the signal circuits 31. The positioning portion 514 is fastened to the probe holder 40. The lead wire 52 is arranged on the connection portion 513, positioning portion 514, and lever arm 515 of the metal pin 51, comprising a metal line 520 and an insulated layer 521 surrounding the metal line 520 coaxially. The insulated layer 521 of each lead wire 52 has a predetermined wall thickness that isolates the metal line 520 from the metal pin 51. The grounding probes 60 are respectively disposed adjacent and in parallel to the signal probes 50. The grounding probes 60 have the same structure with the metal pin 51 of each signal probe 50. Each grounding probe 60 is divided into a probing tip 601 at one end, a posterior portion 602, and a connection portion 603, a positioning portion 604 and a lever arm 605 integrally arranged from the posterior portion 602 toward the probing tip 601 in order. The probing tip 601 is adapted to probe the grounding pad 72 corresponding to the grounding potential of the electronic device under test. The positioning portion 604 is fastened to the probe holder 40. The two ends adjacent to the probing tip 601 and the posterior portion 602 are respectively connected to the metal line 520 of the lead wire 52 of the adjacent signal probe 50.

Figure 6:
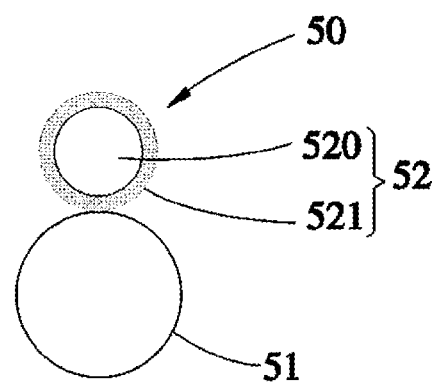
FIG. 6 is a sectional view taken along line 6-6 of FIG. 3.

As stated above, the cantilever-type probe card 2 of the present embodiment uses signal probes 50 each formed of a metal pin 51 and a lead wire 52 to substitute for the prior art design so that each high-frequency test signal transmitting path has a grounding potential nearby, and the two ends of the metal line 520 of the lead wire 52 adjacent to the probing tip 511 and the posterior portion 512 are respectively connected to the adjacent grounding probe 60 to maintain the characteristic impedance matching, providing transmission quality of high-frequency testing signal. Further, because the metal pin 51 and lead wire 52 of each signal probe 50 are abutted against each other in a parallel manner, the diameter of each signal probe 50 is determined subject to the combined diameter of the metal pin 51 and the lead wire 52, and the maximum diameter of each signal probe 50 is about twice of the diameter of the metal pin 51 or smaller, as shown in FIG. 6, and therefore it is not necessary to provide a dielectric layer encapsulating the metal pin 51 and a metal conducting layer encapsulating the dielectric covering as the probe structure of the prior art design. The small-sized probe design of the present invention allows for installation of signal probes 50 in the inner probing zone 303 in a high density manner for high-frequency test while still providing a sufficient buffer effect by the lever arm 605 as the probing tip probing the electronic device and achieving characteristic impedance matching.

Figure 7:
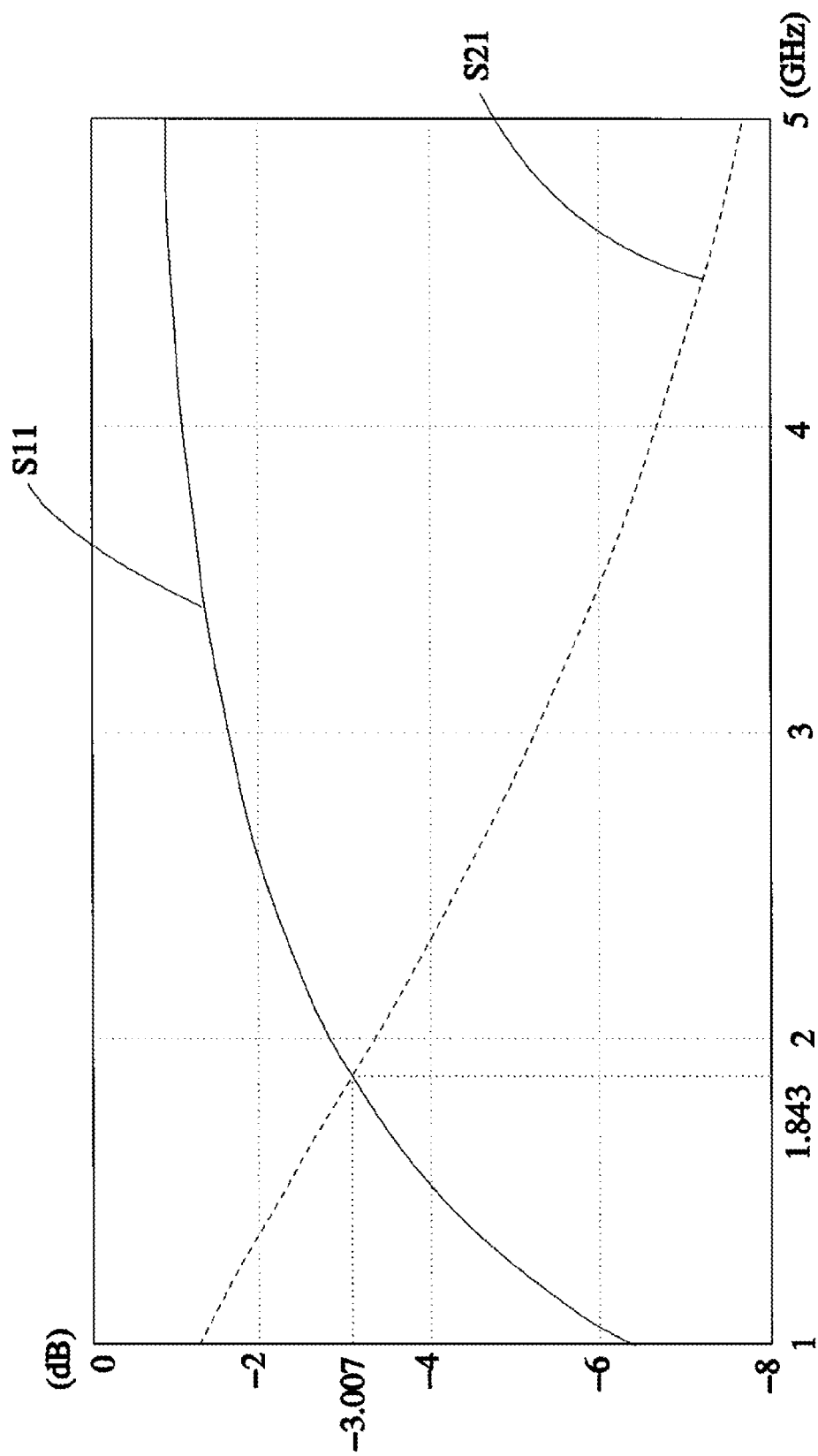
FIG. 7 is a plot showing the signal characteristic of the signal probe according to the first embodiment of the present invention.
Figure 8:
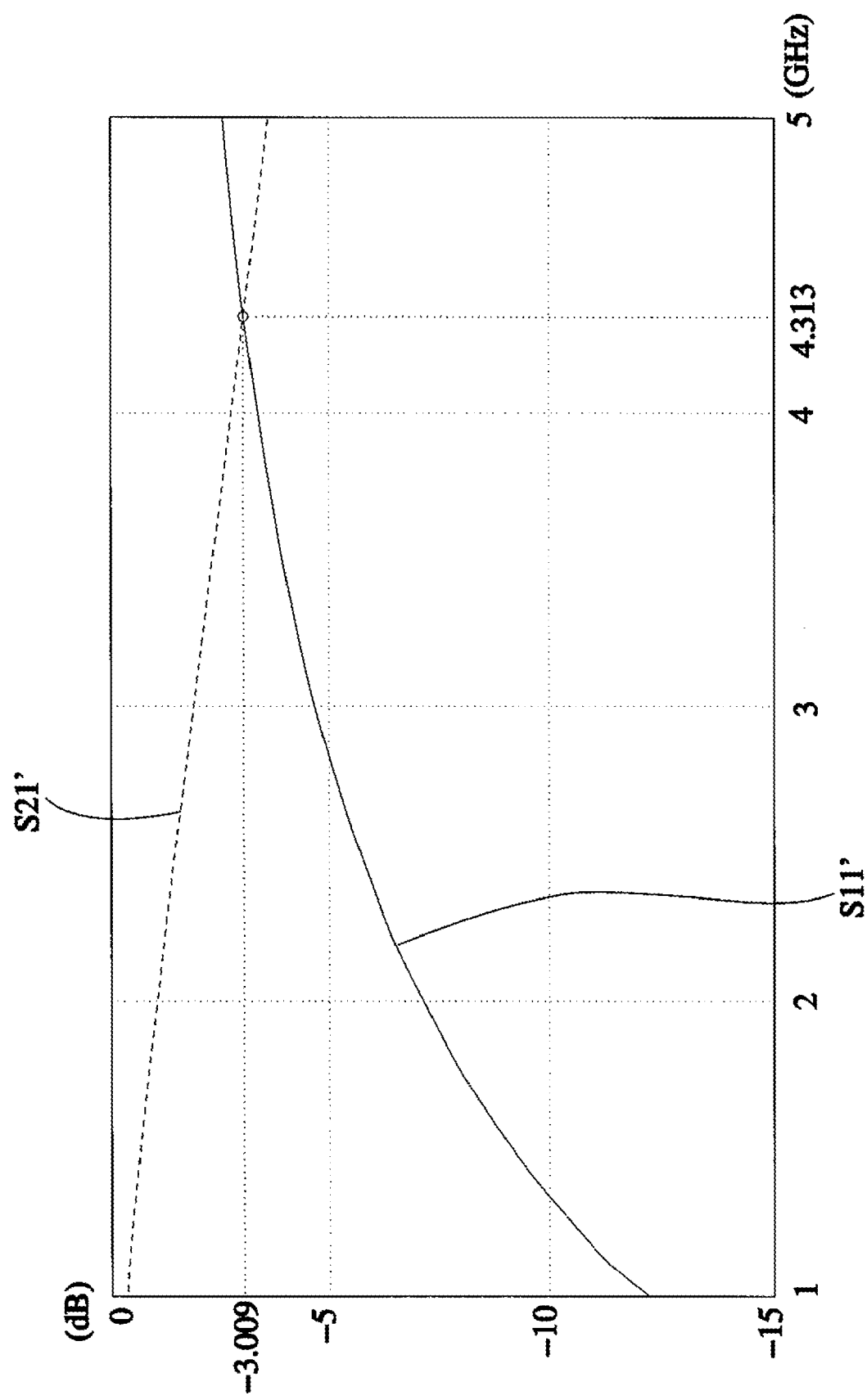
FIG. 8 is a plot showing the signal characteristic of a signal probe that has a relatively larger size than the signal probe which signal characteristic is shown in FIG. 7.

FIGS. 7 and 8 are frequency characteristic curves obtained from signal probes constructed according to the present invention. The frequency characteristic curve shown in FIG. 7 is obtained from a signal probe with the distance between the front end edge of the metal line 520 and the probing tip 511 of the metal pin 51 is 160 mil and the maximum combined diameter of the probe is 10 mil in which the metal pin 51 and the metal line 520 have the same diameter of 4 mil and the wall thickness of the insulated layer 521 is 1 mil. As illustrated in FIG. 7, the return loss curve S11 shows the low return loss during the signal probe is applied for high frequency operation up to a few Giga hertz; the insertion loss curve S21 shows the threshold frequency at –3 dB passband is as high as 1.8 GHz. The frequency characteristic curve shown in FIG. 8 is obtained from a signal probe with the distance between the front end edge of the metal line 520 and the probing tip 511 of the metal pin 51 is 80 mil and the maximum combined diameter of the probe is 20 mil in which the metal pin 51 and the metal line 520 have the same diameter of 8 mil; the wall thickness of the insulated layer 521 is 2 mil. As illustrated in FIG. 8, the return loss curve S11' shows a very low return loss at high frequency band, i.e., the probe has an excellent impedance matching at high frequency band; the insertion loss curve S21' shows the threshold frequency at –3 dB passband is as high as 4.3 GHz, having a good transmission quality of high frequency signaling. Therefore, the all transmission paths under high frequency operation have low loss and excellent impedance matching when the cantilever-type probe card 2 is transmitting high frequency test signals. Further, because every signal probe 50 has a diameter not greater than 20 mil, a big count of probes can be installed in the inner probing zone 303 for probing a big number of electronic devices under a wafer-level test.

A signal probe provided by the present invention is based on the structure of a lead wire on a metal pin so that grounding potential is provided near every signal path to maintain characteristic impedance matching for high-frequency transmission.

Figure 9:
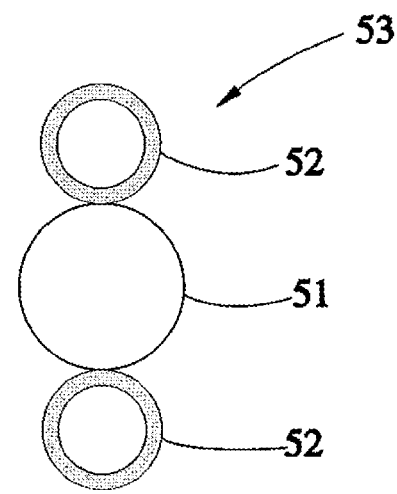
FIG. 9 is a schematic cross sectional view of a signal pin in accordance with a second embodiment of the present invention.

FIG. 9 is a cross sectional view of a signal probe 53 in accordance with a second embodiment of the present invention. According to this embodiment, the signal probe 53 comprises a metal pin 51 and two lead wires 52 abutted at two opposite sides of the metal pin 51. This embodiment prevents the possibility of signal interference at one side, at which the lead wire 52 is not disposed, of the metal pin, thereby having excellent transmission quality during high frequency signaling.

Figure 10:
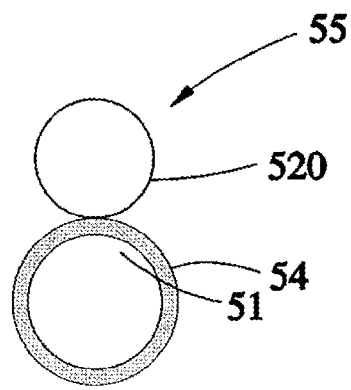
FIG. 10 is a schematic cross sectional view of a signal pin in accordance with a third embodiment of the present invention.

FIG. 10 is a cross sectional view of a signal probe 55 in accordance with a third embodiment of the present invention. According to this embodiment, the signal probe 55 comprises a metal pin 51, an insulated layer 54 surrounding the metal pin 51 coaxially, and a metal line 520 arranged on the periphery of the insulated layer 54. This embodiment protects the metal pin 51 against oxidation or contamination, thereby prolonging the service life of the metal pin 51.

Figure 11:
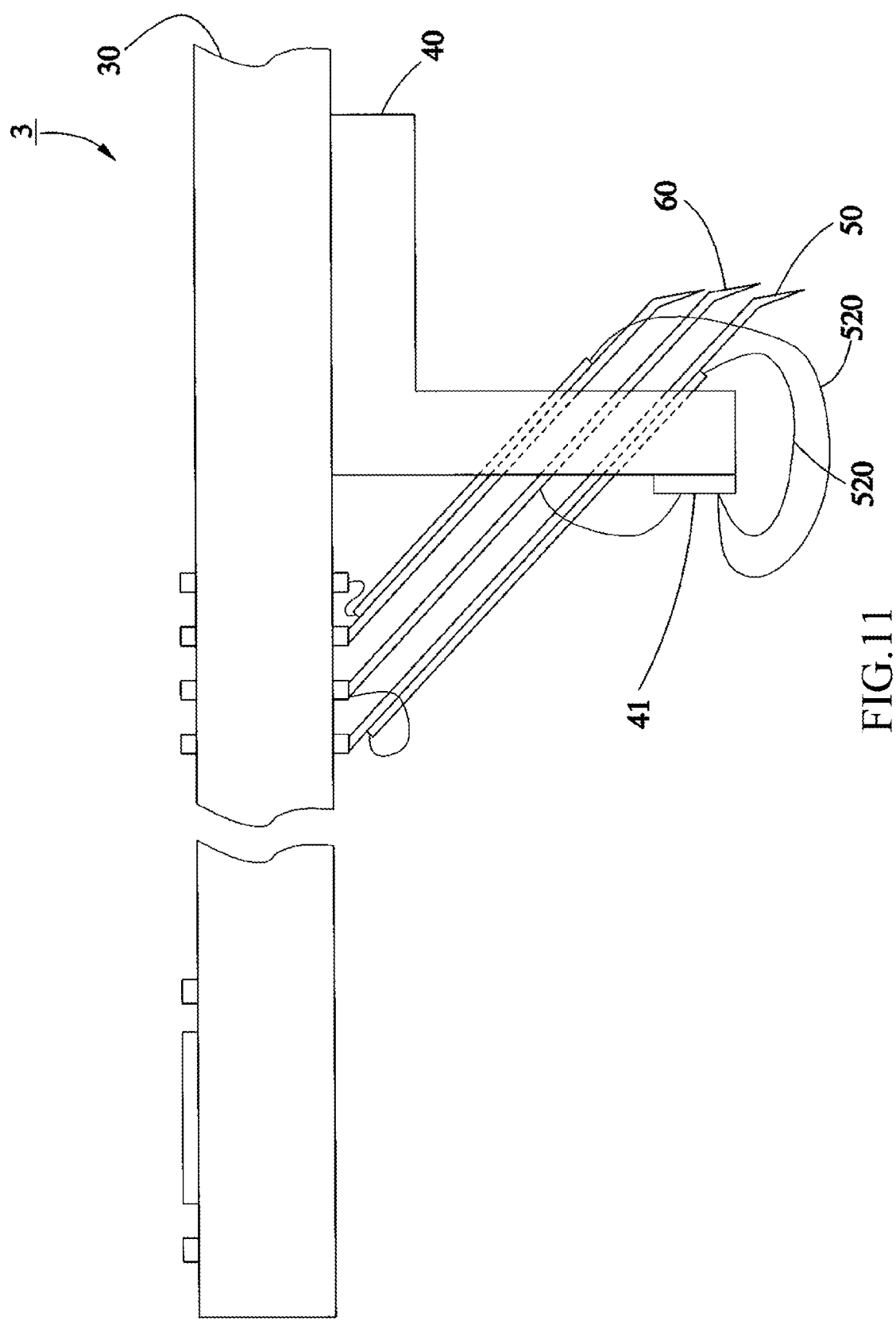
FIG. 11 is a schematic sectional view of a cantilever-type probe card in accordance with a fourth embodiment of the present invention.
Figure 12:
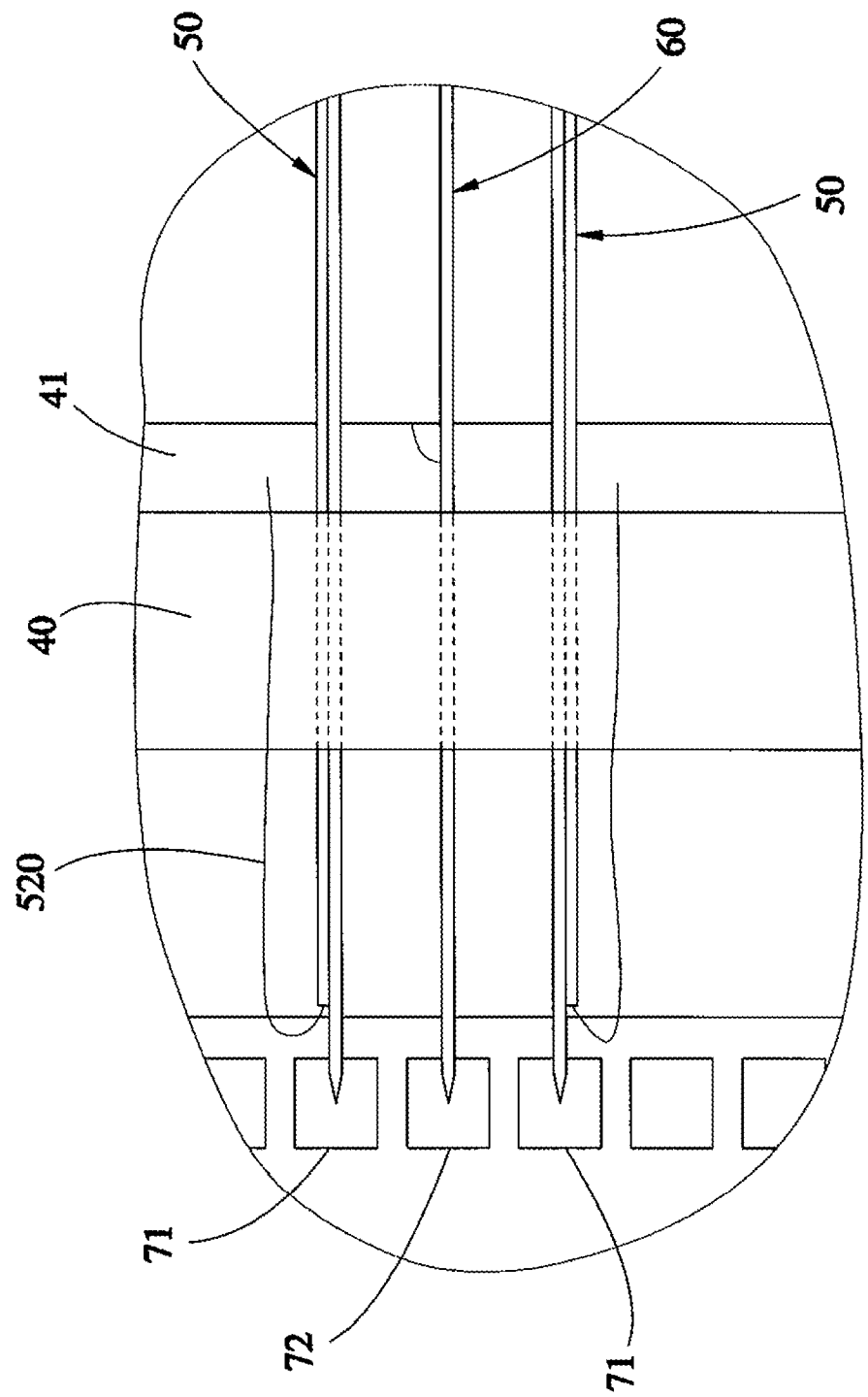
FIG. 12 is an enlarged bottom view of a part of the cantilever-type probe card of the fourth embodiment shown in FIG. 11, showing the relationship between one signal probe and the associated grounding probes.

FIG. 11 illustrates a cantilever-type probe card 3 in accordance with a fourth embodiment of the present invention. This embodiment is substantially similar to the aforesaid first embodiment with the exception that the probe holder 40 according to this fourth embodiment has a grounding surface 41 made of a conducting metal material, and the metal lines 520 of the signal probes 50 and the grounding pins 60 are electrically connected to the grounding surface 41. The grounding surface 411 provides the cantilever-type probe card 3 with an equipotential surface at ground level to maintain a stable common-ground potential in the circuits. Further, one grounding probe 60 is set between each two adjacent signal probes 50, and the lead wires 52 of the two adjacent signal probes 50 are respectively arranged at an outer side, as shown in FIG. 12, thereby maintaining the characteristic impedance of the signal probes 50 and preventing other signal interferences. This embodiment greatly reduces the number of the grounding probe 60 to be installed, and is practical for testing electronic circuits of wafers that have a relatively less number of grounding pads.

Figure 13:
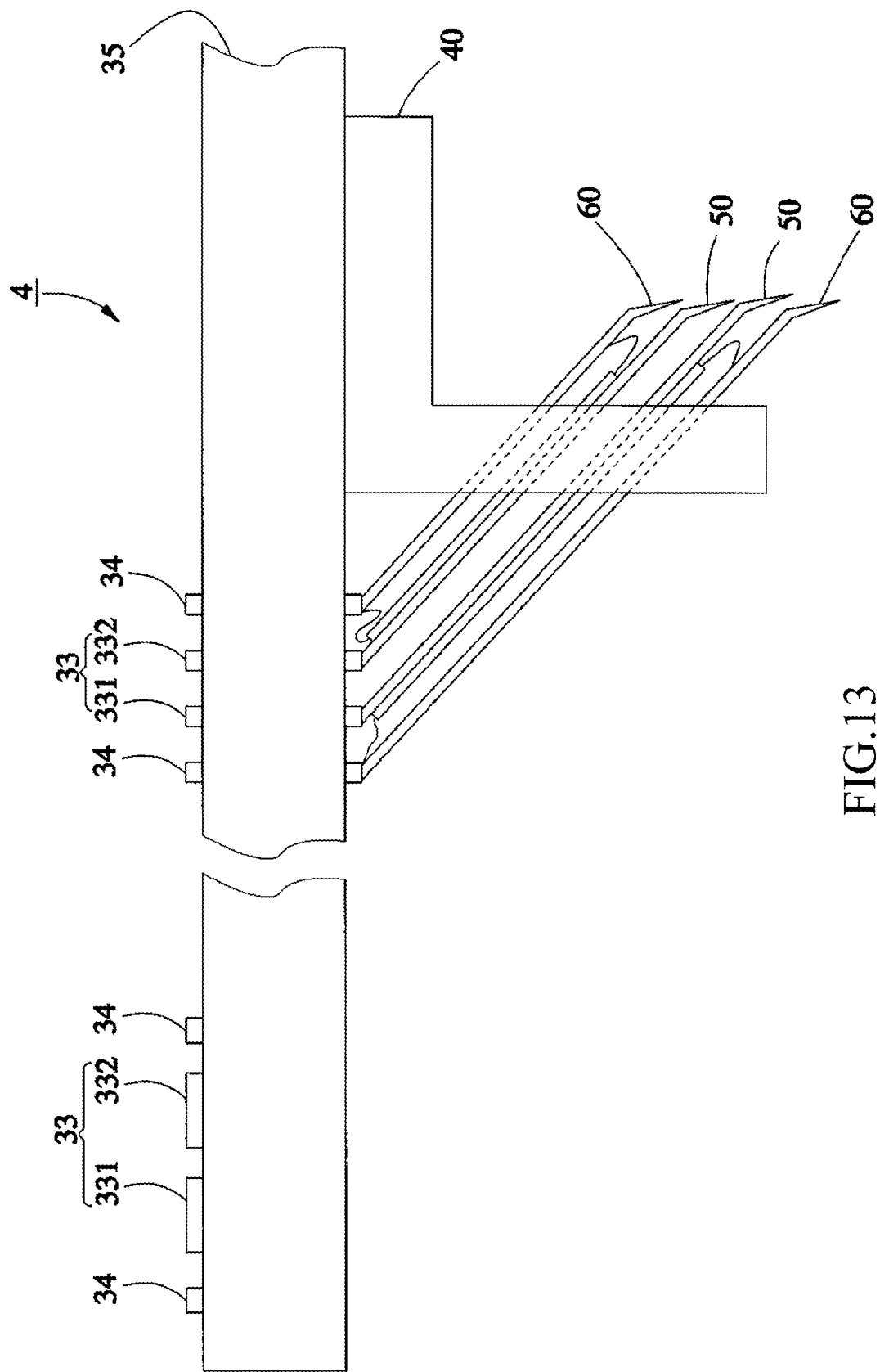
FIG. 13 is a schematic sectional view of a cantilever-type probe card in accordance with a fifth embodiment of the present invention.

The signal transmission structure for high-frequency test of the present invention can also be used for high frequency differential signal pair to test driver ICs applied for display panel. FIG. 13 shows a cantilever-type probe card 4 in accordance with a fifth embodiment of the present invention. This embodiment is substantially similar to the aforesaid first embodiment with the exception that the circuit board 35 of the cantilever-type probe card 4 comprises a plurality of differential signal circuits 33 each formed of two signal wires 331 and 332 for transmitting a differential signal pair, and a plurality of grounding circuits 34 respectively arranged at two sides of each differential signal circuit 33 at a predetermined distance to maintain the characteristic impedance of the respective differential signal pairs. The signal wires 331 and 332 of the differential signaling circuits 33 are respectively electrically connected to the signal probes 50. The grounding circuits 34 are respectively electrically connected to the grounding probes 60. The aforesaid structural features enable the cantilever-type probe card 4 to maintain the characteristic impedance matching during transmission of differential signals.

Figure 14:
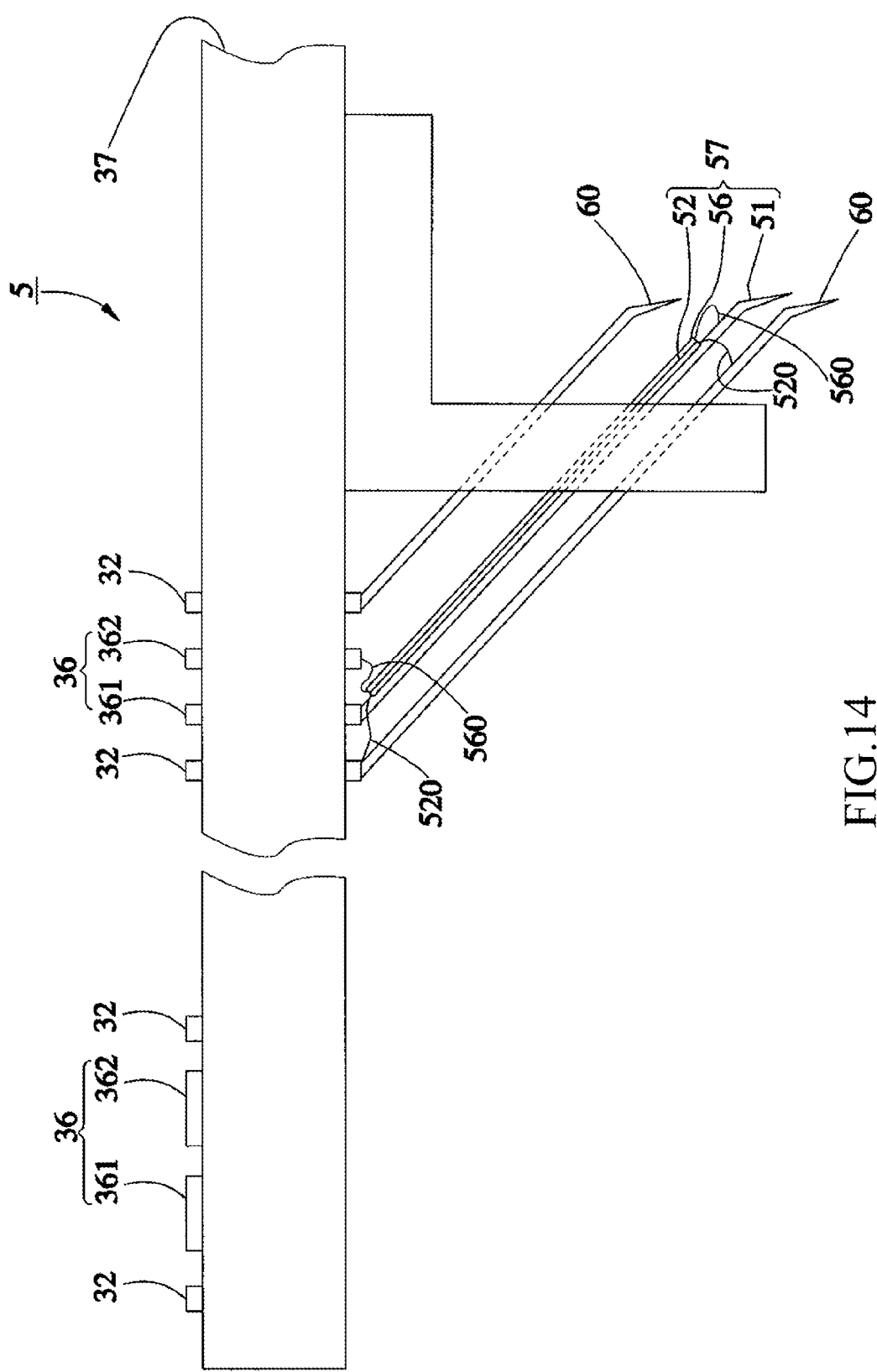
FIG. 14 is a schematic sectional view of a cantilever-type probe card in accordance with a sixth embodiment of the present invention.

FIG. 14 shows a cantilever-type probe card 5 in accordance with a sixth embodiment of the present invention. This embodiment is substantially similar to the aforesaid first embodiment with the exception that the circuit board 37 and the signal probes 57 provide different transmission paths for output of test signal and return of correspondingly resultant sense signal, preventing interference between test signal and resultant signal.

The circuit board 37 has arranged thereon multiple signal circuits 36. Each signal circuit 36 comprises a forcing wire 361 and a sensing wire 362. The forcing wire 361 is adapted to transmit test condition signal from the test machine to the respective electronic device in the test sample. The sensing wire 362 is adapted to transmit sense signal of corresponding test result from the respective electronic device in the test sample to the test machine. Further, at least one grounding circuit 32 is respectively disposed adjacent to the forcing wire 361 and the sensing wire 362 to maintain the characteristic impedance of the signal path.

Figure 15:
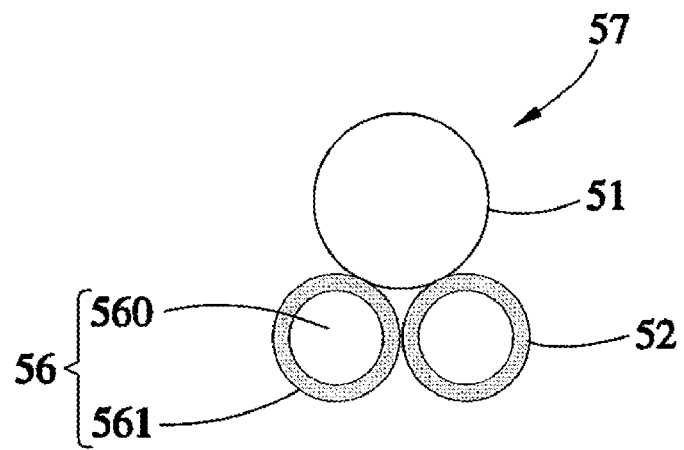
FIG. 15 is a cross sectional view of a signal probe for a cantilever-type probe card in accordance with the sixth embodiment of the present invention.

Referring to FIGS. 14 and 15, each signal probe 57 comprises a metal pin 51, and two lead wires, namely, a first lead wire 56 and a second lead wire 52 respectively arranged on the metal pin 51. Structurally the same as the aforesaid lead wires 52, the first lead wire 56 comprises a metal line 560 and an insulated layer 561 surrounding the metal line 560 coaxially. The two opposite ends of the metal line 560 are respectively electrically connected to the metal pin 51 and the associated sensing wire 362. The second lead wire 52 is electrically connected to the associated grounding circuit 32. The metal pin 51 is electrically connected to the associated forcing wire 361. Further, a grounding probe 60 is respectively disposed near each signal probe 57 and kept apart from the associated signal probe 57 at a predetermined distance.

Therefore, the forcing wire 361 of each signal circuit 36 outputs test condition signal from the test machine to the associated metal pin 51, and the associated first lead wire 56 and the sensing wire 362 of each signal circuit 36 provide a signal path for receiving the correspondingly resultant signal from the test sample to the test machine. Because the forcing wire 361 and sensing wire 362 of each signal circuit 36 and the associated metal pin 51 and the first lead wire 56 of each signal probe 57 are in match with the arrangement of the associated grounding circuit 32 and the associated second lead wire 52 and the associated grounding probe 60, the cantilever-type probe card 5 of this sixth embodiment maintains the characteristic impedance for the transmission of high frequency signals and prevents cross-talk interference between test signal and sense signal. Therefore, the cantilever-type probe card 5 of this sixth embodiment has a better high frequency test quality.

Figure 16:
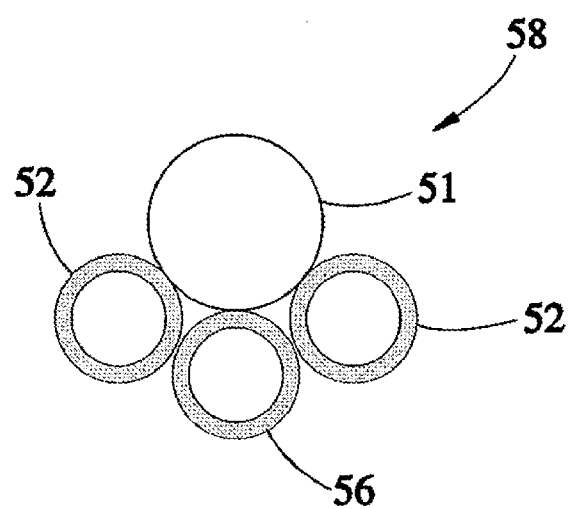
FIG. 16 is a cross sectional view of a signal probe for a cantilever-type probe card in accordance with a seventh embodiment of the present invention.

An additional second lead wire 52 may be added to each signal probe 57 to provide an optimal characteristic impedance matching. FIG. 16 is a cross sectional view of a signal probe 58 in accordance with a seventh embodiment of the present invention. According to this embodiment, the signal probe 58 comprises a metal pin 51, a first lead wire 56, and two second lead wires 52 respectively arranged between the metal pin 51 and the first lead wire 56 at two sides. The signal probe 58 according to this seventh embodiment effectively eliminates cross-talk interference between the test signal and the sense signal and interference with other test signals, and therefore the signal probe 58 has excellent transmission quality of high frequency signal.

Figure 17:
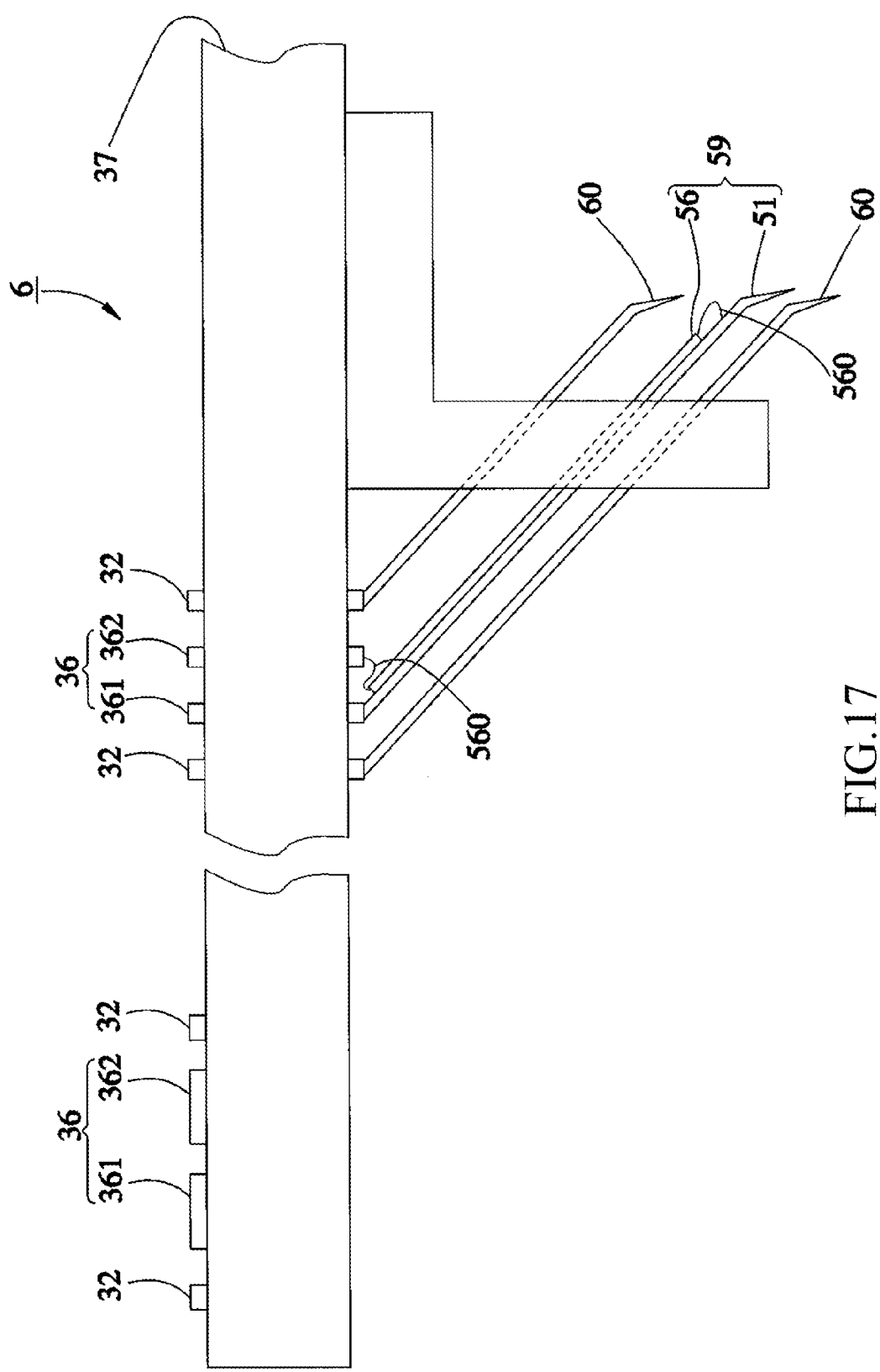
FIG. 17 is a schematic sectional view of a cantilever-type probe card in accordance with an eighth embodiment of the present invention.

To reduce the size of one signal probe, the invention provides an eighth embodiment as shown in FIG. 17. As illustrated, each signal probe 59 of the cantilever-type probe card 6 in accordance with the eighth embodiment of the present invention comprises a metal pin 51 and a first lead wire 56. Further, at least one grounding probe 60 is disposed near each signal probe 59 to maintain the characteristic impedance of the associated signal probe 59. According to this embodiment, two grounding probes 60 are arranged at each of two opposite sides relative to the metal pin 51 and the first lead wire 56 of each signal probe 59 to maintain the characteristic impedance matching of the test signal and the sense signal and to avoid interference with other test signals, thereby obtaining excellent transmission quality of high-frequency signal.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A probe for high frequency signal transmission, comprising:
   a metal pin having a probing tip, a posterior portion and a positioning portion between the probing tip and the posterior portion for mounting to a circuit board;
   at least one metal line spacedly arranged on the metal pin and having two opposite ends electrically connected to grounding potential; and
   at least one insulated layer disposed between the metal pin and the at least one metal line, wherein the probing tip is capable of contacting a testing pad and the posterior portion is connected to a signal circuit.

2. The probe as claimed in claim 1, wherein the at least one insulated layer coaxially surrounds the at least one metal line and has a predetermined wall thickness corresponding to the distance between the metal pin and the at least one metal line.

3. The probe as claimed in claim 1, wherein the probe itself has a maximum diameter about two times of the diameter of the metal pin.

4. The probe as claimed in claim 1, wherein the probe itself has a maximum diameter smaller than two times of the diameter of the metal pin.

5. The probe as claimed in claim 1, wherein the at least one insulated layer coaxially surrounds the metal pin and has a predetermined wall thickness corresponding to the distance between the metal pin and the at least one metal line.

6. The probe as claimed in claim 1, comprising two said metal lines spacedly arranged at two sides of the metal pin.

7. The probe as claimed in claim 1, wherein the at least one metal line extends along the metal pin from the posterior portion to a part of the metal pin between the probing tip and the positioning portion.

8. The probe as claimed in claim 1, comprising at least two metal lines, and one of the metal lines is electrically connected to the probing tip of the metal pin.

9. The probe as claimed in claim 8, wherein the at least two metal lines respectively extend along the metal pin from the posterior portion to a part of the metal pin between the probing tip and the positioning portion.

10. A probe for high frequency signal transmission, installed in a probe card, the probe card comprising a grounding probe and the grounding probe electrically connected to grounding potential; the probe for high frequency signal transmission comprising:

a metal pin having a probing tip, a posterior portion and a positioning portion between the probing tip and the posterior portion for mounting to a circuit board;

at least one metal line spacedly arranged on the metal pin and having one end electrically connected to the grounding probe; and at least one insulated layer disposed between the metal pin and the at least one metal line, wherein the probing tip is capable of contacting a testing pad and the posterior portion is connected to a signal circuit.

11. The probe as claimed in claim 10, wherein the metal line extends along the metal pin from the posterior portion to a part of the metal pin between the probing tip and the positioning portion.

12. The probe as claimed in claim 11, wherein the distance between the metal pin and the metal line is a fixed distance, at the posterior portion of the metal pin.

13. The probe as claimed in claim 10, wherein each pair of the metal pin and the grounding probe are configured side by side, respectively.

14. The probe as claimed in claim 10, wherein the probe card is a cantilever probe card having a circular shape.

* * * * *